United States Patent
Rabary et al.

(10) Patent No.: US 8,054,130 B2
(45) Date of Patent: Nov. 8, 2011

(54) METHOD FOR MEASURING THE SATURATION RATE OF AN AUDIO AMPLIFIER

(75) Inventors: Vincent Rabary, Champagnier (FR); Robert Cittadini, Fontaine (FR); Alexandre Huffenus, Grenoble (FR); Gaël Pillonnet, Lyons (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 12/751,387

(22) Filed: Mar. 31, 2010

(65) Prior Publication Data

US 2010/0253429 A1    Oct. 7, 2010

(30) Foreign Application Priority Data

Mar. 31, 2009  (FR) ...................................... 09 52063

(51) Int. Cl.
*H03F 3/217* (2006.01)
(52) U.S. Cl. .................... 330/251; 330/207 A
(58) Field of Classification Search .............. 330/207 A, 330/251
See application file for complete search history.

(56) References Cited

U.S. PATENT DOCUMENTS

| | | | |
|---|---|---|---|
| 4,326,170 A * | 4/1982 | Levy | 330/251 |
| 5,633,940 A | 5/1997 | Wassink | |
| 6,314,278 B1 | 11/2001 | Zamat | |
| 7,146,015 B2 * | 12/2006 | Ramsden | 330/251 |
| 2004/0184621 A1 | 9/2004 | Andersen et al. | |
| 2006/0008095 A1 | 1/2006 | Tsuji | |
| 2008/0018508 A1 | 1/2008 | Filipovic et al. | |
| 2009/0219090 A1 * | 9/2009 | Wong et al. | 330/251 |

FOREIGN PATENT DOCUMENTS

EP     1128549 A2     8/2001

* cited by examiner

*Primary Examiner* — Khanh Nguyen
(74) *Attorney, Agent, or Firm* — Lisa K. Jorgenson; E. Russell Tarleton; Seed IP Law Group PLLC

(57) ABSTRACT

A method and corresponding circuit that adjusts the gain of an audio output stage having a class D amplifier, this method including the steps of setting the gain to a nominal value, analyzing an output signal during successive clock periods, counting the number of clock periods during which the signal is in a state corresponding to a saturation, decreasing the gain if the number reaches, before the end of a first time interval, a value corresponding to a first percentage, maintaining the gain constant if, at the end of a second time interval, different from the first interval, the number corresponds to a second percentage being comprised between the first percentage and a third percentage, and increasing the gain if, at the end of the second time interval, the number corresponds to a fourth percentage, lower than the third percentage.

15 Claims, 5 Drawing Sheets

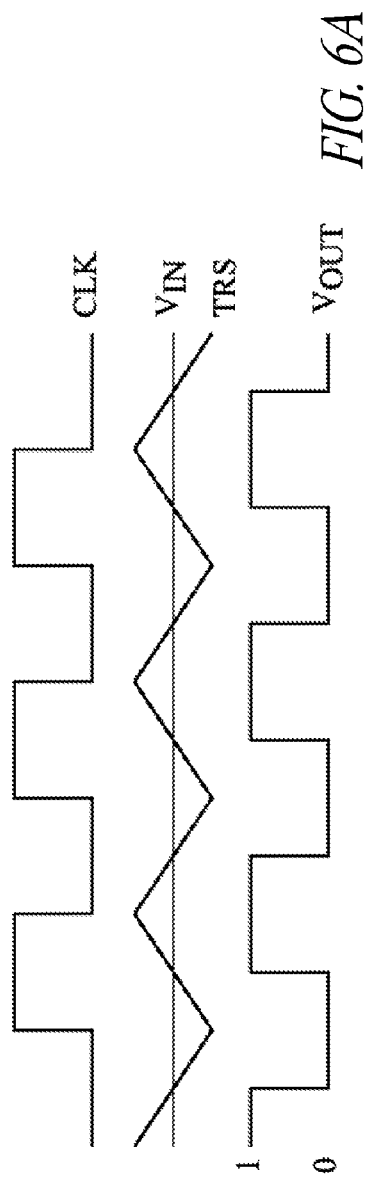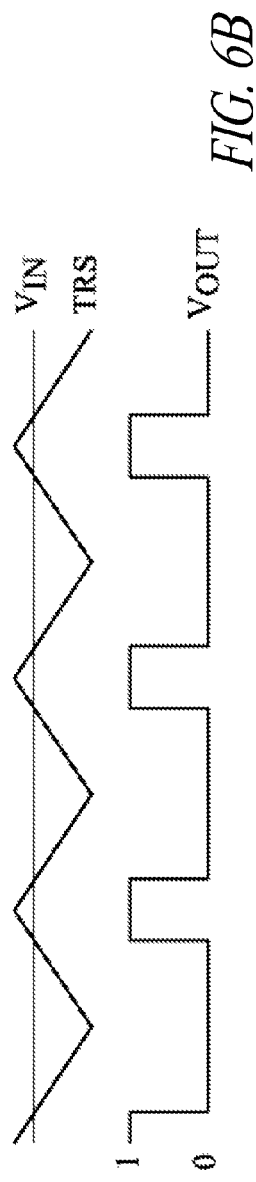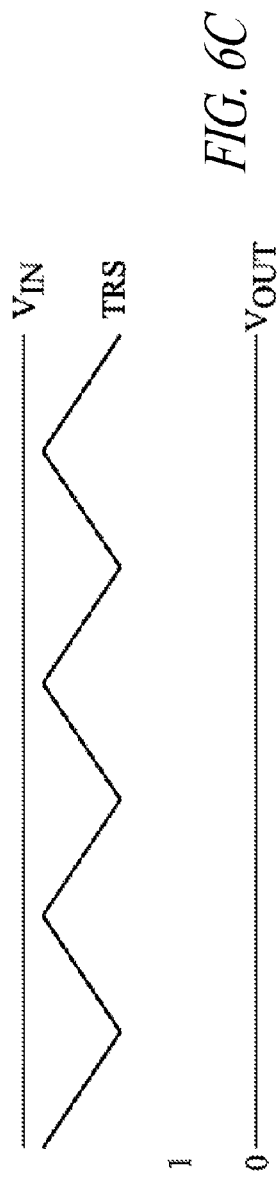

METHOD FOR MEASURING THE SATURATION RATE OF AN AUDIO AMPLIFIER

BACKGROUND

1. Technical Field

The present disclosure relates to audio devices especially utilizing an output amplifier connected to a speaker, the output amplifier capable of entering a saturation state.

2. Description of the Related Art

An audio device generally includes upstream stages, the main function of which is to process or to decode and to pre-amplify an audio signal stored in any support, for example, an internal memory, an optical disk, or any incident audio signal, and an output power amplifier, having the function of generating an analog audio signal adapted to output speakers.

FIG. 1A schematically shows the terminal portion of an audio device. An amplifier 1 receives an audio signal $V_{IN}$, generated by upstream stages, and delivers an audio signal $V_{OUT}$, which is an amplified image of signal $V_{IN}$, to a speaker 3 of a known configuration. Amplifier 1 has a maximum output amplitude $V_{CC}$ determined by its supply voltage.

FIGS. 1B and 1C show examples of the variation of audio signal $V_{OUT}$ along time.

FIG. 1B shows a case of optimal use of amplifier 1, that is, where the amplitude of the output audio signal is maximum (equal to $V_{CC}$).

FIG. 1C shows another example of the variation of audio signal $V_{OUT}$ along time. In this case, amplifier 1 is strongly saturated and the output signal is clipped. The characteristics of the sound signal are then altered, especially by the introduction of unwanted harmonics.

The power of output signal $V_{OUT}$ is equal to the surface area delimited by the curve representative of the signal and by the straight line representing the midpoint, or common-mode D.C. voltage, of amplifier 1. This surface is shown by the hatched areas of FIGS. 1B and 1C. Due to the clipping of the signal peaks, the output power increases along with the saturation. The power of an optimal output signal, such as shown in FIG. 1B (amplitude equal to $V_{CC}$ and no clipping), corresponds to the nominal power of amplifier 1. In case of a very strong saturation (FIG. 1C), the power of output signal $V_{OUT}$ may double with respect to this nominal power. Further, the signal then includes a large number of distinct harmonics that may be critical for the speaker.

Thus, a clipping in case of a saturation implies to provide a speaker 3 capable of withstanding up to twice the nominal power of the output signal. This is regrettable and is contrary to today's miniaturization aims.

An alternative solution to the clipping of output audio signal $V_{OUT}$ in case of a saturation is thus desired.

A protection method, currently designated as "soft-clipping" in the art, which systematically rounds off, by filtering, the audio signal peaks, enables elimination of slight saturations. A disadvantage of this method is that it decreases the nominal power of the amplifier. Further, the signal is distorted, even when the amplifier is not saturated. This protection is further inefficient against strong saturations.

Automatic gain control methods, currently designated in the art as AGC, are also used. These methods include bringing too intense peaks of the audio signal down the maximum output amplitude $V_{CC}$ of amplifier 1. Means for measuring the average value of output voltage $V_{OUT}$ are connected to means for controlling the gain of amplifier 1. Such methods strengthen the low-amplitude portions of the signal and attenuate the strong portions. A disadvantage of this type of method is the loss of data as to the amplitude of the audio signal. Further, the measurement of the average value of voltage $V_{OUT}$ at the output of amplifier 1 delays the gain adjustment.

A maximum saturation rate in signal $V_{OUT}$ capable of being withstood by speaker 3 without causing any damage is generally determined (for example by simulation). It is thus desirable to be able to accurately determine the saturation rate of output signal $V_{OUT}$. Existing solutions for measuring the saturation rate, especially based on measurements of the average level of output voltage $V_{OUT}$, are inaccurate and introduce delays.

BRIEF SUMMARY

An embodiment of the present disclosure aims at providing a method enabling to accurately measure the saturation rate of an audio device output amplifier.

An embodiment of the present disclosure further aims at providing a method enabling to adapt the gain of the output amplifier to the measured saturation.

One embodiment of the present disclosure enables choosing the best compromise between the useful power transmitted by the application, the distortion of the sound signal, and the speaker protection.

The present disclosure applies such methods to audio devices in which the output amplifier is a class D amplifier.

Thus, an embodiment of the present disclosure provides a method for adjusting the gain of an audio output stage comprising a class D amplifier, this method including the steps of setting the gain to a nominal value, analyzing an output signal of the class D amplifier during successive clock periods, counting the number of clock periods among these successive periods during which the signal is in a state corresponding to a saturation of the stage, decreasing the gain if the number reaches, before the end of a first time interval, a value corresponding to a first percentage of the total number of clock periods of the first time interval, maintaining the gain constant if, at the end of a second time interval, different from the first interval, the number corresponds to a second percentage, comprised between the first percentage and a third percentage lower than the first percentage, of the total number of clock periods of the second time interval, and increasing the gain if, at the end of the second time interval, the number corresponds to a fourth percentage, lower than the third percentage, of the total number of clock periods of the second time interval.

According to an embodiment of the present disclosure the gain is decreased only if the gain is greater than a minimum value, and wherein the gain is increased only if the gain is smaller than its nominal value.

According to an embodiment of the present disclosure the second time interval is greater than the first time interval.

According to an embodiment of the present disclosure the frequency of the clock signal is at least ten times greater than the highest frequencies to be reproduced by the audio output stage.

According to an embodiment of the present disclosure the frequency of the clock signal ranges between 200 and 400 kHz.

According to an embodiment of the present disclosure the third percentage is equal to 0.

According to an embodiment of the present disclosure the first percentage ranges between 30 and 60 percent.

According to an embodiment of the present disclosure the first time interval ranges between 0.5 and 5 milliseconds.

According to an embodiment of the present disclosure the second time interval ranges between 7 and 20 milliseconds According to an embodiment of the present disclosure the gain decrease and increase are performed by increments.

An embodiment of the present disclosure provides a device for adjusting the gain of an audio output stage comprising a class D amplifier, this device comprising a clock signal generator that generates a clock signal having successive clock periods, a circuit that analyzes, during successive clock periods, an output signal of the class D amplifier, a circuit that counts the number of clock periods, among these successive periods, during which the signal is in a state corresponding to a saturation of the stage, and a circuit adapted to decrease the gain if the number reaches, before the end of a first time interval, a value corresponding to a first percentage of the total number of clock periods of the first time interval, to maintain the gain constant if, at the end of a second time interval, different from the first interval, the number corresponds to a second percentage, comprised between the first percentage and a third percentage lower than the first percentage, of the total number of clock periods of the second time interval, and to increase the gain if, at the end of the second time interval, the number corresponds to a fourth percentage, lower than the third percentage, of the total number of clock periods of the second time interval.

An embodiment of the present disclosure provides a circuit comprising an amplifier structured to receive an audio signal as input and to provide an amplified audio signal on an output, the amplifier further configured to generate a temporary voltage on another output thereof; and a comparator circuit having a first input to receive the temporary voltage from the amplifier and to further receive a D.C. voltage and to output a comparison signal that is received at a latch circuit driven by a clock signal, and to output the comparison signal to a counter that is driven by the same clock signal as the latch circuit, the counter outputting an output value on an output thereof.

According to an embodiment of the present disclosure the comparator outputs the comparison signal at a high state when the temporary voltage signal exceeds the reference voltage, which is an indication the audio signal is in a saturation stage, and otherwise outputs a low comparison voltage signal when the audio signal is not in a saturation condition, the output of the counter having a value that indicates the number of clock periods during which the audio signal is in a saturation state.

According to an embodiment of the present disclosure the amplifier comprises a preamplifier that outputs the temporary voltage signal that is also received at a power stage in the amplifier, the power stage configured to output the output voltage signal.

According to an embodiment of the present disclosure the counter receives a reset signal that controls a resetting of the output value of the counter after a selected number of clock periods.

According to an embodiment of the present disclosure the amplifier is configured to output the output voltage as a series of pulses having an average value proportional to an amplitude of the audio signal at input at a given time.

The foregoing features and advantages of the present disclosure will be discussed in detail in the following non-limiting description of specific embodiments in connection with the accompanying drawings.

BRIEF DESCRIPTION OF THE SEVERAL VIEWS OF THE DRAWINGS

FIGS. 6A to 6C are partial simplified timing diagrams showing examples of the variation of the voltages at different points of the output stage of FIG. 5.

DETAILED DESCRIPTION

Figures 1A, 1B, 1C:
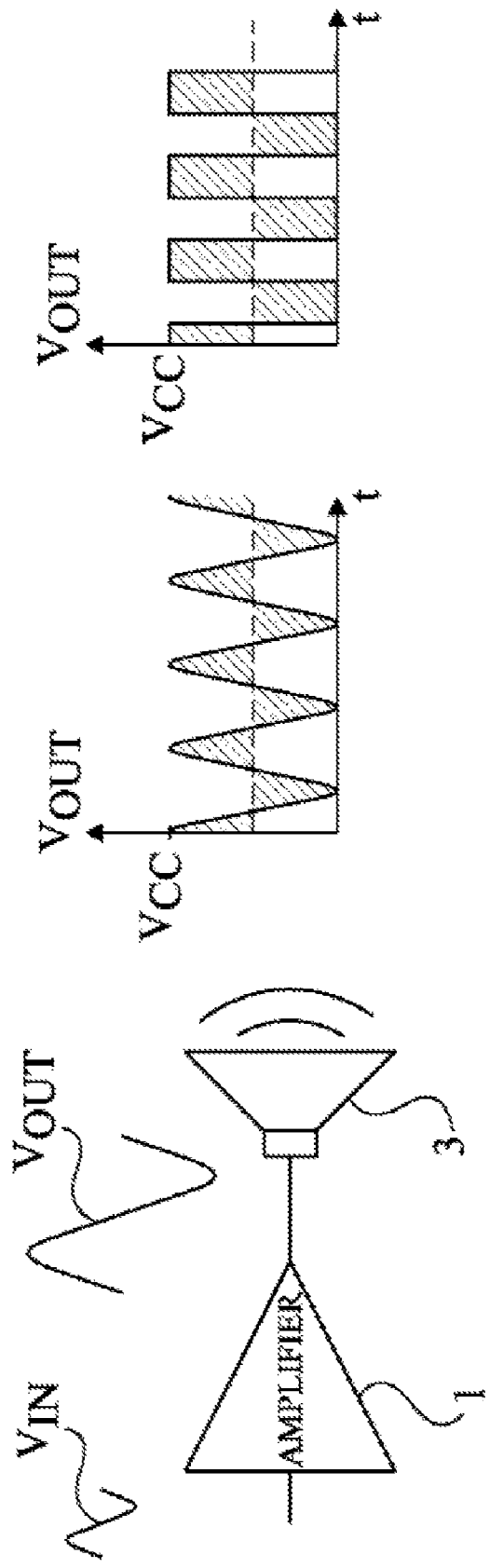
FIG. 1A, previously described, schematically shows the output of an audio device.
FIGS. 1B and 1C, previously described, are partial simplified timing diagrams showing two examples of the variation of output voltage $V_{OUT}$ of output amplifier 1.

For clarity, the same elements have been designated with the same reference numerals in the different drawings. Further, the timing diagrams of FIGS. 1A, 1B, 3A to 3C, and 6A to 6C are not drawn to scale.

Figure 2:
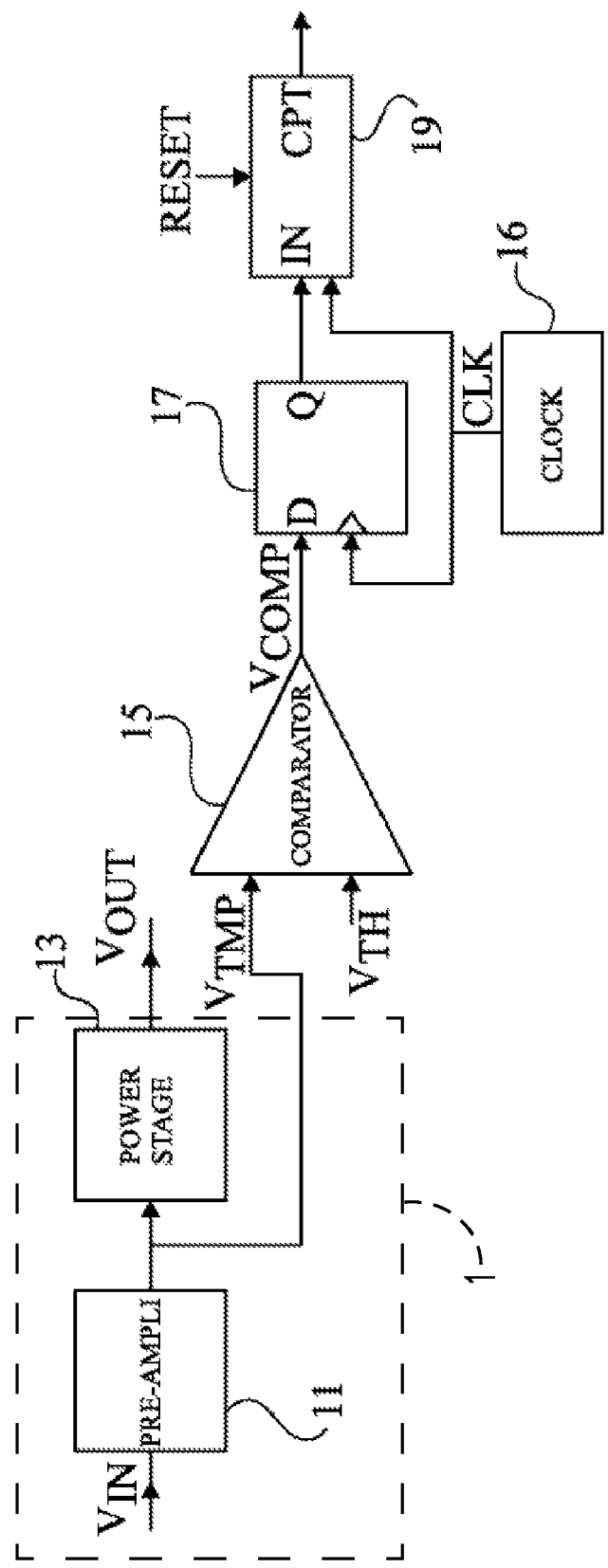
FIG. 2 shows an example of architecture of the output stage of an audio device according to a first embodiment of the present disclosure.

FIG. 2 shows an example of an audio device output stage. A power amplifier 1 receives an audio signal $V_{IN}$, generated by upstream stages (not shown), and provides an audio signal $V_{OUT}$, which is an amplified image of signal $V_{IN}$. Amplifier 1 is formed of a pre-amplifier stage 11 and of a power stage 13. A comparator 15 receives output signal $V_{TMP}$ of pre-amplifier stage 11 and a D.C. voltage $V_{TH}$ having a level corresponding to a saturation of amplifier 1. A clock signal generator 16 provides a clock signal CLK. A D flip-flop 17, driven by clock signal CLK, receives, via a D input terminal, output signal $V_{COMP}$ of comparator 15. Flip-flop 17 copies the state (high or low) of its D input on its Q output at each rising edge of clock signal CLK. The Q output of D flip-flop 17 is connected to an input terminal IN of a counter 19. Counter 19, driven by clock signal CLK, increments its output value at each rising edge of signal CLK, if input IN is in the high state. A signal RESET controls the reset of output value CPT of counter 19 after a selected number of clock periods.

Figure 3:
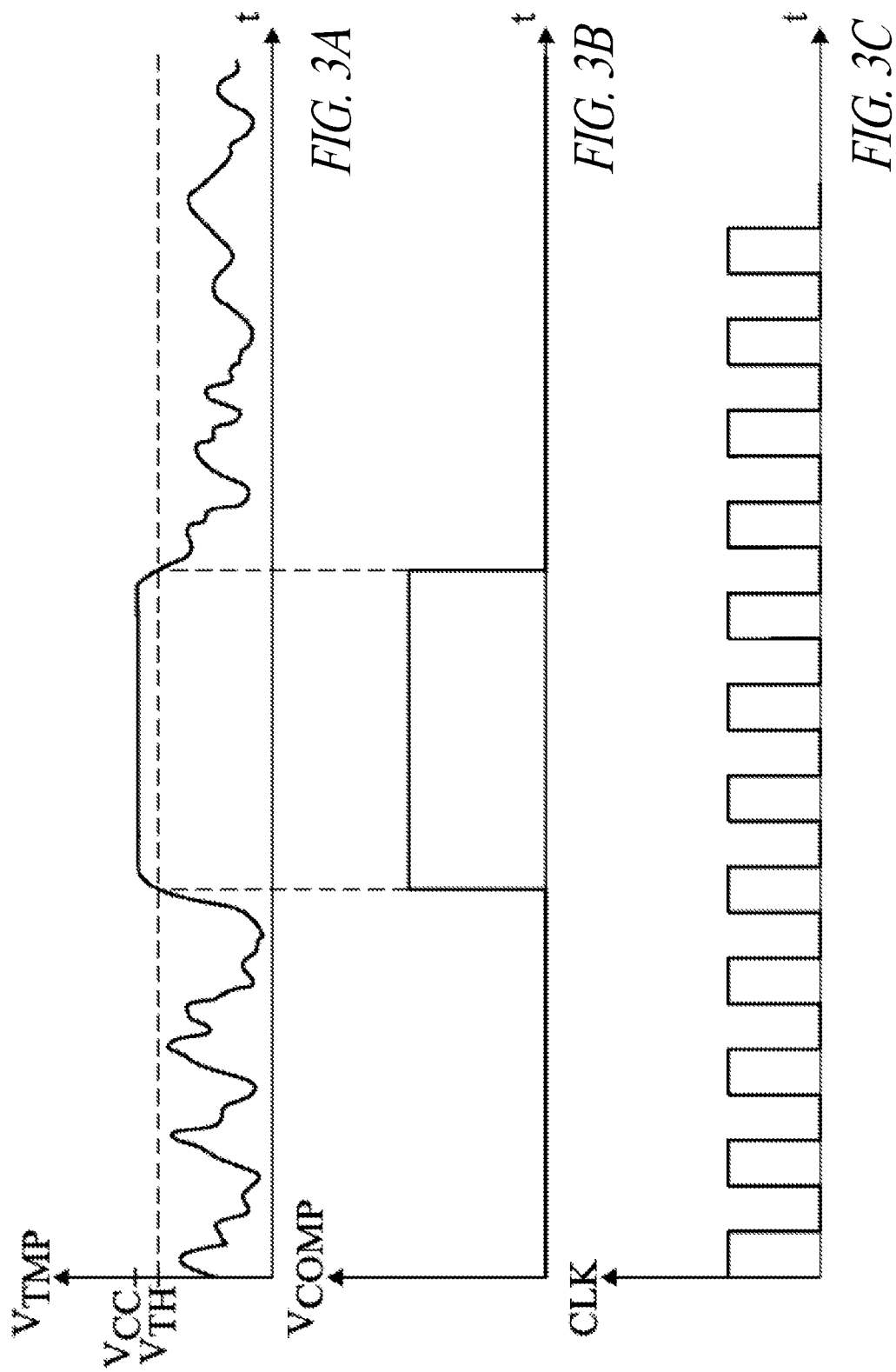
FIGS. 3A to 3C are partial simplified timing diagrams showing examples of the variation of the voltages along time at different points of the output stage of FIG. 2.

FIGS. 3A to 3C are partial simplified timing diagrams showing examples of variation of the voltages at different points of the output stage of FIG. 2. FIG. 3A shows output signal $V_{TMP}$ of pre-amplifier signal 11. FIG. 3B shows output signal $V_{COMP}$ of comparator 15. FIG. 3C shows clock signal CLK.

When signal $V_{TMP}$ exceeds voltage $V_{TH}$ corresponding to a saturation of amplifier 1, output signal $V_{COMP}$ of comparator 15 is in a high state. When $V_{TMP}$ does not exceed voltage $V_{TH}$, $V_{COMP}$ is in a low state. At each rising clock edge, flip-flop 17 stores the state of output $V_{COMP}$ of comparator 15. Thus, output CPT of counter 19 indicates the number of clock periods during which amplifier 1 is in a saturation state.

For a selected time interval, the percentage of the clock periods during which the amplifier is saturated is an accurate indication of the saturation rate of amplifier 1. The accuracy of the measurement is determined by the frequency of the clock signal. To have an accurate measurement, the frequency of the clock signal must be greater than the highest frequencies to be reproduced by the audio device. Preferably, the frequency of the clock signal must be at least 10 times greater than the highest frequencies to be reproduced by the audio device. A clock rated between 200 and 400 kHz may for example be used. Further, the time interval during which the saturation rate is determined must be sufficiently long to enable tolerating a certain amount of saturation in the signal provided to the speakers. Indeed, it may be advantageous, for increasing the emitted noise power, to tolerate a certain amount of saturation in the signal provided to the speakers. A clock rated at 250 kHz may for example be used, and the saturation rate may be measured over frequency intervals ranging between 0.5 and 20 ms, that is, from 125 to 5,000 clock periods.

Figure 4:
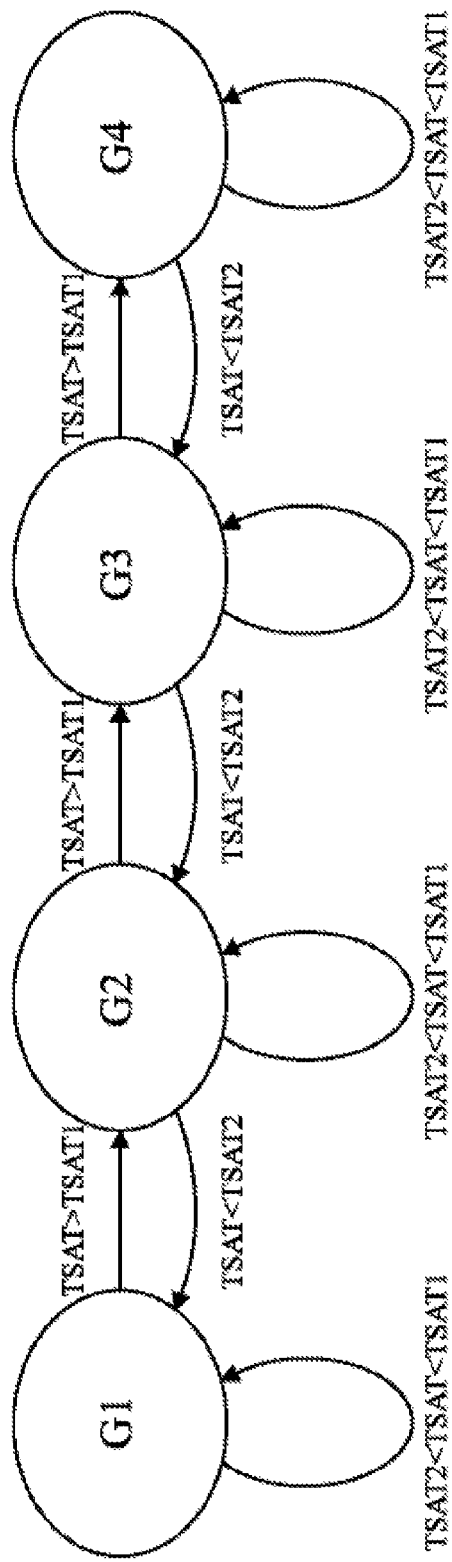
FIG. 4 schematically shows steps of a method for adjusting the gain of an output amplifier of an audio device according to the saturation.

FIG. 4 very schematically illustrates steps of a method for adjusting the gain of output amplifier 1 according to the saturation. The gain of amplifier 1 is variable and may take one of four successive discrete values G1 to G4, with G1>G2>G3>G4. Value G1 corresponds to the nominal gain of amplifier 1. Value G4 corresponds to the minimum gain of amplifier 1. To form such a variable gain device, switches may be used to select resistors for determining the gain value.

The method for adjusting the gain according to the saturation includes the steps of:
  measuring saturation rate TSAT of amplifier 1 during a time interval, according to the method described hereabove in relation with FIGS. 2 and 3A to 3C,
  if TSAT is greater than a high value TSAT1 corresponding to a high saturation state, and if the gain is not equal to its minimum value G4, decreasing the gain by one increment,
  if TSAT is smaller than a low value TSAT2 corresponding to a negligible saturation state, and if the gain is not equal to its nominal value G1, increasing the gain by one increment,
  if TSAT ranges between TSAT1 and TSAT2, corresponding to a tolerated saturation level, maintaining the gain unchanged.

The time interval during which saturation rate TSAT is measured may be set differently according to whether the decision resulting from this measurement is a decrease, a maintaining, or an increase of the gain. For example, a decrease or a maintaining of the gain will result from a measurement of the saturation rate over a time interval from 0.5 to 5 ms while a gain increase will result from a measurement of the saturation rate over a greater time interval, from 7 to 20 ms for example.

The saturation of amplifier 1 can thus be finely measured and the saturation rate of amplifier 1 can be adapted whatever the desired sound quality, transmitted power, and speaker protection criteria.

The measurement of the saturation rate TSAT consists in counting, during successive clock periods corresponding to a given time interval, the number of clock periods during which a signal is in a state corresponding to a saturation of the amplifier. In practice, as soon as this number reaches a value corresponding to a percentage of the total number of clock periods of the given time interval equals to the high saturation rate TSAT1, the gain may be decreased by one increment, even if the time interval has not ended. This enables efficiently protecting the output speakers.

An aspect of the present disclosure is to apply the above-described methods for measuring the saturation rate and adjusting the gain to the case where the output amplifier is a class D amplifier. In this case, the saturation measurement method is particularly efficient and simple to implement.

Figure 5:
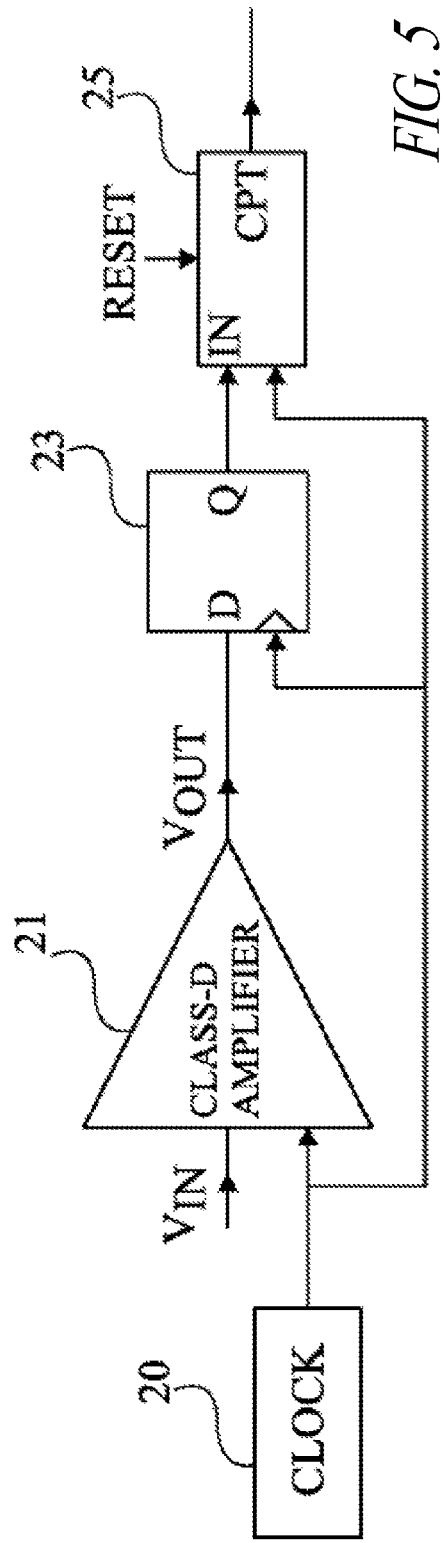
FIG. 5 shows an example of architecture of the output stage of an audio device according to a second embodiment of the present disclosure.

FIG. 5 shows an example of an output stage of an audio device according to a specific embodiment of the present disclosure in the case where the output amplifier is a class D amplifier. A class D amplifier 21 receives an audio signal $V_{IN}$, generated by the upstream stages, and a clock signal CLK, generated by a clock signal generator 20. Amplifier 21 provides an audio signal $V_{OUT}$, which is an amplified image of signal $V_{IN}$.

A class D amplifier is an amplifier having an output stage with power transistors used as switches. Output signal $V_{OUT}$ thus has discrete states. As will be discussed in further detail hereafter in relation with FIGS. 6A to 6C, input signal $V_{IN}$ is generally converted into a series of pulses ($V_{OUT}$) having an average value proportional to the amplitude of signal $V_{IN}$ at a given time. Such a method is currently designated in the art as a pulse-width modulation (PWM). To recover the amplified image of input signal $V_{IN}$ from discrete signal $V_{OUT}$, a low-pass filter may be used, to eliminate the low-frequency components introduced by the pulse-width modulation. In the case of an audio device, the speaker is generally used as a low-pass filter. Discrete signal $V_{OUT}$ can thus be directly applied to speaker 3. Class D amplifiers are frequently used in audio devices, especially due to their low power loss generation. Typically, from 80 to 95% of the consumed supply power is given back to the speaker.

FIGS. 6A to 6C are partial simplified timing diagrams illustrating the operation of class D amplifier 21 of FIG. 5. A triangular signal TRS of same frequency as clock signal CLK is generated in amplifier block 21. Amplifier 21 includes a comparator, not shown, which receives input signal $V_{IN}$ and triangular signal TRS. Output signal $V_{OUT}$ of amplifier 21 is linked to the output signal of this comparator, that is, it is in the high state when $V_{IN}$<TRS and in the low state when $V_{IN}$>TRS. Amplitude $V_{CC}$ of triangular signal TRS is determined by the amplifier supply voltage. When $V_{IN}$>$V_{CC}$, the amplifier is no longer capable of proportionally reproducing the audio signal. It is the to be in a saturation state. For a proper operation, the frequency of clock signal CLK must be greater than the highest frequencies to be reproduced by the audio device. A clock rated at 250 kHz may for example be used.

FIG. 6A shows the case of a zero input signal $V_{IN}$. Output signal $V_{OUT}$ then is a periodic signal, of same frequency as clock signal CLK, and having a duty cycle equal to 50%.

FIG. 6B shows the case of a positive D.C. input signal $V_{IN}$, of smaller value than amplitude $V_{CC}$ of triangular signal TRS. Output signal $V_{OUT}$ then is a periodic signal, of same frequency as clock signal CLK, with a duty cycle smaller than 50%.

FIG. 6C shows the case of a positive D.C. input signal $V_{IN}$, of greater value than amplitude $V_{CC}$ of triangular signal TRS. This is a case of saturation of amplifier 21. Output signal $V_{OUT}$ then remains in the low state.

In non-saturated operation (FIGS. 6A and 6B), output signal $V_{OUT}$ is in the high state at each falling edge of clock signal CLK. If output signal $V_{OUT}$ is in the low state at a falling edge of clock signal CLK, this means that the amplifier is saturated (FIG. 6C).

As illustrated in FIG. 5, a D flip-flop 23 driven by clock signal CLK receives output signal $V_{OUT}$ of amplifier 21 on its D input. A counter 25 is driven by clock signal CLK. Input IN of counter 25 is connected to the Q output of flip-flop 23. Output value CPT of counter 25 is incremented at each rising edge of signal CLK if its input IN is in the low state. A signal RESET controls the reset of output value CPT of counter 19 after a selected number of clock periods.

Thus, output CPT of counter 25 indicates the number of clock periods during which amplifier 21 is in the saturation state.

The saturation rate in amplifier 21 during a selected time interval can be accurately deduced therefrom.

Measurements of the saturation rate over time intervals ranging between 1 and 20 ms, that is, from 250 to 5,000 clock periods if a clock rated at 250 kHz is used, may be performed.

The present disclosure thus provides a method for measuring the saturation rate which particularly advantageously applies to audio devices including a class D output amplifier. Indeed, such devices already have a clock signal source and comparison means for providing a discrete signal characterized by pulse jumps each time the amplifier is in the saturation state. The implementation of the saturation rate determination method described herein then only requires the addition of a small number of logic gates to perform the functions of D flip-flop 23 and of counter 25.

Specific embodiments of the present disclosure have been described. Various alterations and modifications will occur to those skilled in the art. In particular, the phases and the levels of the previously described periodic signals may be inverted, and the circuits driven by clock signals may be triggered indifferently on rising edges or on falling edges of the clock. Further, the present disclosure is not restricted to the sole output stages including a D flip-flop and a counter such as described hereabove. It will be within the abilities of those skilled in the art to implement the desired operation whatever the device used to count the number of clock periods during which the amplifier is saturated. It will be within the abilities of those skilled in the art to implement the desired operation whatever the class of the output amplifier used.

The specific embodiment of the present disclosure previously described in relation with FIGS. 5 and 6A to 6C is not restricted to the sole audio devices including a class D amplifier generating a pulse-width modulation output signal (PWM) but applies to any audio device generating an output signal with discrete states. In the example described hereabove in relation with FIG. 4, the gain can take four distinct values. The present disclosure is of course not limited to this sole specific case.

On the other hand, examples of digital values have been given in the previous descriptions, especially relating to the clock frequencies and to the time intervals of measurement of the saturation rate. The present disclosure is not limited to these sole specific cases. It will be within the abilities of those skilled in the art to adapt the present disclosure for an easy implementation of an automatic gain control (AGC) method known in prior art.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method for adjusting the gain of an audio output stage that includes a class D amplifier, the method comprising:
    setting the gain to a nominal value,
    analyzing an output signal of the class D amplifier during successive clock periods,
    counting the number of clock periods among these successive periods during which the output signal is in a state corresponding to a saturation of the audio output stage,
    decreasing the gain if the number of counted clock periods reaches, before the end of a first time interval, a value corresponding to a first percentage of the total number of clock periods of the first time interval,
    maintaining the gain constant if, at the end of a second time interval, different from the first time interval, the number of counted clock periods corresponds to a second percentage, comprised between the first percentage and a third percentage lower than the first percentage, of the total number of clock periods of the second time interval, and
    increasing the gain if, at the end of the second time interval, the number of counted clock periods corresponds to a fourth percentage, lower than the third percentage, of the total number of clock periods of the second time interval.

2. The method of claim 1, wherein the gain is decreased only if the gain is greater than a minimum value, and wherein the gain is increased only if the gain is smaller than its nominal value.

3. The method of claim 1, wherein the second time interval is greater than the first time interval.

4. The method of claim 1, wherein the frequency of a clock signal is at least ten times greater than the highest frequencies to be reproduced by the audio output stage.

5. The method of claim 1, wherein the frequency of a clock signal ranges between 200 and 400 kHz.

6. The method of claim 1, wherein the third percentage is equal to 0.

7. The method of claim 1, wherein the first percentage ranges between 30 and 60 percent.

8. The method of claim 1, wherein the first time interval ranges between 0.5 and 5 milliseconds.

9. The method of claim 1, wherein the second time interval ranges between 7 and 20 milliseconds.

10. The method of claim 1, wherein the gain decrease and increase are performed by increments.

11. A device for adjusting the gain of an audio output stage that has a class D amplifier, comprising:
    a clock signal generator structured to generate a clock signal having successive clock periods,
    a circuit structured to analyze, during successive clock periods, an output signal of the class D amplifier,
    a circuit structured to count the number of clock periods, among these successive periods, during which the output signal is in a state corresponding to a saturation of the audio output stage, and
    a circuit adapted to:
        decrease the gain if the number of counted clock periods reaches, before the end of a first time interval, a value corresponding to a first percentage of the total number of clock periods of the first time interval,
        maintain the gain constant if, at the end of a second time interval, different from the first time interval, the number of counted clock periods corresponds to a second percentage, comprised between the first percentage and a third percentage lower than the first percentage, of the total number of clock periods of the second time interval, and increase the gain if, at the end of the second time interval, the number of counted clock periods corresponds to a fourth percentage, lower than the third percentage, of the total number of clock periods of the second time interval.

12. A circuit, comprising:

an amplifier structured to receive an audio signal as input and to provide an amplified audio signal on an output, the amplifier further configured to generate a temporary voltage on another output thereof; and a comparator circuit having a first input structured to receive the temporary voltage from the amplifier and to further receive a D.C. voltage and to output a comparison signal that is received at a latch circuit driven by a clock signal, and to output the comparison signal to a counter that is driven by the same clock signal as the latch circuit, the counter outputting an output value on an output thereof, the comparator outputting the comparison signal at a high state when the temporary voltage exceeds the D.C. voltage, which is an indication the audio signal is in a saturation stage, and otherwise outputting a low comparison voltage signal when the audio signal is not in a saturation condition, the output of the counter having a value that indicates the number of clock periods during which the audio signal is in a saturation state.

13. The circuit of claim 12, wherein the amplifier comprises a preamplifier that outputs the temporary voltage that is also received at a power stage in the amplifier, the power stage configured to output an output voltage signal.

14. The circuit of claim 12, wherein the counter is structured to receive a reset signal and to reset the output value of the counter after a selected number of clock periods in response to the reset signal.

15. The circuit of claim 13, wherein the amplifier is configured to output the output voltage as a series of pulses having an average value proportional to an amplitude of the audio signal at input at a given time.

* * * * *